US009054157B2

(12) United States Patent
Mina et al.

(10) Patent No.: US 9,054,157 B2
(45) Date of Patent: Jun. 9, 2015

(54) HIGH PERFORMANCE ON-CHIP VERTICAL COAXIAL CABLE, METHOD OF MANUFACTURE AND DESIGN STRUCTURE

(71) Applicant: International Business Machines Corporation, Armonk, NY (US)

(72) Inventors: Essam Mina, South Burlington, VT (US); Guoan Wang, Lexington, SC (US); Wayne H. Woods, Jr., Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/076,656

(22) Filed: Nov. 11, 2013

(65) Prior Publication Data

US 2014/0065817 A1    Mar. 6, 2014

Related U.S. Application Data

(62) Division of application No. 13/018,963, filed on Feb. 1, 2011, now Pat. No. 8,629,536.

(51) Int. Cl.
*H01L 21/768* (2006.01)
*H01L 23/498* (2006.01)
*G06F 17/50* (2006.01)

(52) U.S. Cl.
CPC ......... *H01L 21/768* (2013.01); *Y10T 29/49123* (2015.01); *H01L 23/49827* (2013.01); *G06F 17/505* (2013.01); *H01L 2924/0002* (2013.01)

(58) Field of Classification Search
CPC ................. H01L 2924/00; H01L 2924/0002; H01L 21/768; H01L 23/4927
USPC .................................. 438/622–629, 667–668
See application file for complete search history.

(56) References Cited

U.S. PATENT DOCUMENTS

| 5,117,276 | A | 5/1992 | Thomas et al. |
|---|---|---|---|
| 5,338,897 | A | 8/1994 | Tsay et al. |
| 5,357,138 | A | 10/1994 | Kobayashi |
| 5,587,119 | A | 12/1996 | White |
| 6,624,521 | B2 | 9/2003 | Staiculescu et al. |
| 6,943,452 | B2 | 9/2005 | Bertin et al. |
| 7,015,569 | B1 | 3/2006 | Tetelbaum |

(Continued)

OTHER PUBLICATIONS

Ho et al., "Development of Coaxial Shield Via in Silicon Carrier for High Frequency Application", Electronics Packaging Technology Conference, 2006, EPTC '06, 8th, pp. 825-830, Dec. 6-8, 2006.

(Continued)

*Primary Examiner* — Cuong Q Nguyen
(74) *Attorney, Agent, or Firm* — Michael A. Petrocelli; Anthony J. Canale

(57) ABSTRACT

A high performance on-chip vertical coaxial cable structure, method of manufacturing and design structure thereof is provided. The coaxial cable structure includes an inner conductor and an insulating material that coaxially surrounds the inner conductor. The structure further includes an outer conductor which surrounds the insulating material. Both the inner and outer conductors comprise a plurality of metal layers formed on different wiring levels and interconnected between the different wiring levels by conductors. The coaxial cable structure is formed upon a surface of a semiconductor substrate and is oriented in substantially perpendicular alignment with the surface.

13 Claims, 15 Drawing Sheets

(56) References Cited

U.S. PATENT DOCUMENTS

| | | |
|---|---|---|
| 7,811,919 B2 | 10/2010 | Daley et al. |
| 8,242,604 B2 | 8/2012 | Volant et al. |
| 8,377,749 B1 * | 2/2013 | Patterson ............... 438/123 |
| 2002/0139579 A1 | 10/2002 | Kwark |
| 2003/0137053 A1 * | 7/2003 | Okayama ............... 257/758 |
| 2008/0093112 A1 | 4/2008 | Kushta |
| 2009/0108457 A1 | 4/2009 | Christensen et al. |
| 2009/0108465 A1 | 4/2009 | Becker et al. |
| 2010/0163296 A1 | 7/2010 | Ko et al. |
| 2011/0095435 A1 | 4/2011 | Volant et al. |

OTHER PUBLICATIONS

Notice of Allowance dated Sep. 3, 2013 for U.S. Appl. No. 13/018,963, filed Feb. 1, 2011, titled: High Performance On-Chip Vertical Coaxial Cable, Method of Manufacture and Design Structure.

* cited by examiner

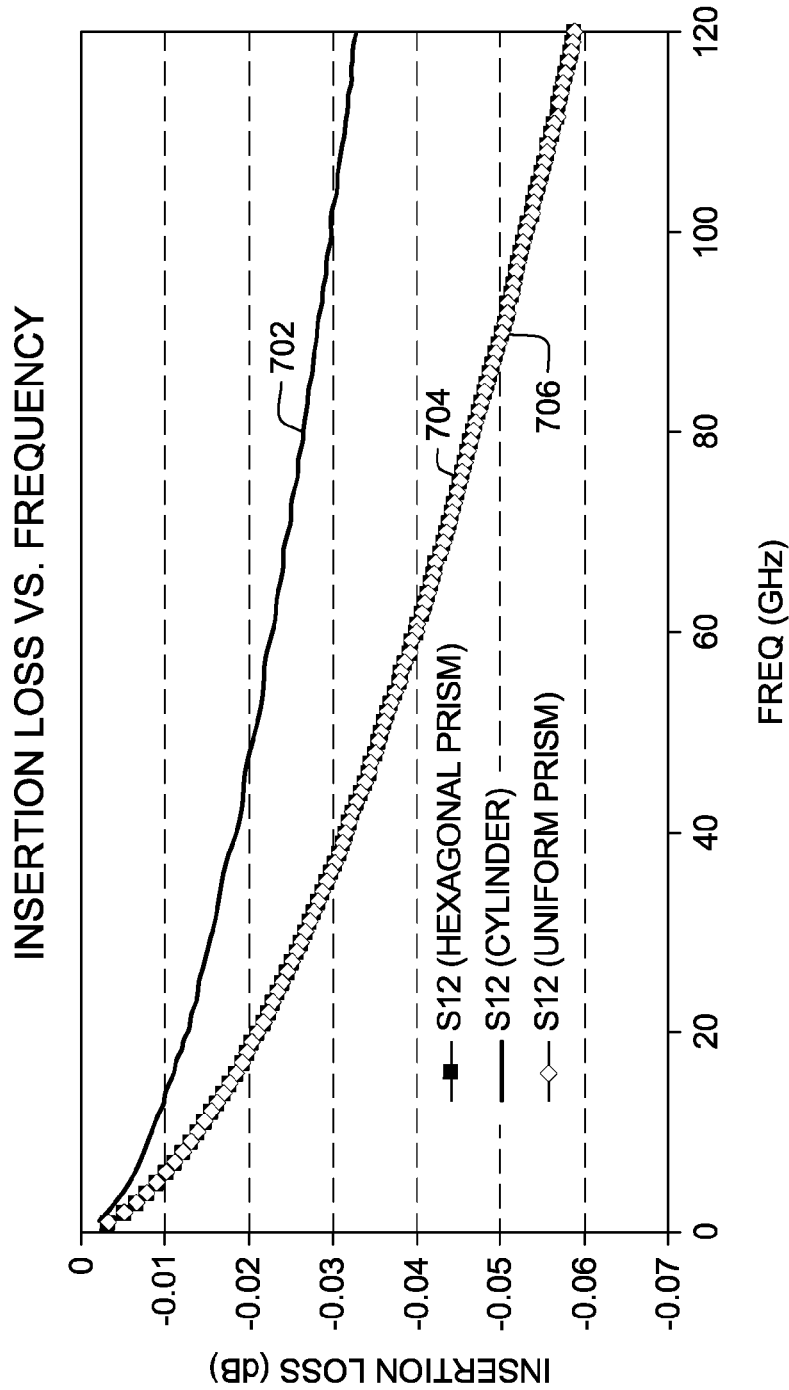

HIGH PERFORMANCE ON-CHIP VERTICAL COAXIAL CABLE, METHOD OF MANUFACTURE AND DESIGN STRUCTURE

CROSS REFERENCE TO RELATED APPLICATIONS

This application is a divisional of U.S. application Ser. No. 13/018,963, filed Feb. 1, 2011.

BACKGROUND

Field of the Invention

The present invention relates to the field of coaxial cables, and more particularly, to a high performance on-chip vertical coaxial cable, method of manufacturing the same and design structure thereof.

A coaxial cable is an electrical cable generally applied as a high-frequency transmission line to carry a high frequency or broadband signal. The coaxial cable can be used for connecting radio transmitters and receivers with their antennas, Internet connections, and for distributing cable television signals, among other applications. Sometimes, DC power (called a bias) is added to the signal to supply the equipment at the other end, as in direct broadcast satellite receivers, with operating power. One advantage of the coaxial cable over other types of transmission line is that ideally the electromagnetic field carrying the signal exists only in the space between the inner and outer conductors, so the coaxial cable cannot interfere with or suffer interference from external electromagnetic fields. Another area which could utilize coaxial cables is integrated circuit technology. On-chip coaxial cable is advantageous in connecting integrated circuits to reduce the noise and crosstalk.

Conventional on-chip coaxial cable is built within metal layers of a semiconductor chip and is typically arranged along a horizontal plane, as shown in FIG. 1. However, this design has several disadvantages associated with it. One disadvantage involves the distance between an outside shielding conductor and a signal line. More specifically, in a conventional on-chip coaxial cable structure, since this structure is typically formed within metal layers and positioned along a horizontal plane, the distance between the outside conductor and the signal line is not substantially uniform and is limited by the available metal technologies in the semiconductor chip. Additionally, this prior art design limits the shape of the coaxial cable structure to a rectangular prism or a cube.

Accordingly, there exists a need in the art to overcome the deficiencies and limitations described hereinabove.

SUMMARY

In an aspect of the invention, a coaxial cable structure comprises an inner conductor and an insulating material that coaxially surrounds the inner conductor. The structure further comprises an outer conductor which surrounds the insulating material. Both the inner and outer conductors are comprised of a plurality of metal layers formed on different wiring levels and interconnected between the different wiring levels by conductors. The coaxial cable structure is formed upon a surface of a semiconductor substrate and is oriented in substantially perpendicular alignment with the surface.

In another aspect of the invention, a method for fabricating a coaxial cable structure comprises forming a first shape of an inner conductor in a plurality of metal layers formed on different wiring levels and interconnected between the different wiring levels by a first conductor and forming a second shape of an outer conductor in the plurality of metal layers formed on different wiring levels and interconnected between the different wiring levels by a second conductor. The coaxial cable structure is formed upon a surface of a semiconductor substrate and is oriented in substantially perpendicular alignment with the surface.

In another aspect of the invention, a design structure embodied in a machine readable medium for designing, manufacturing, or testing an integrated circuit is provided. The design structure comprises the structures and/or methods of the present invention.

A more complete understanding of the present invention, as well as further features and advantages of the present invention, will be obtained by reference to the following detailed description and drawings. It is to be understood that both the foregoing general description and the following detailed description are exemplary and explanatory only, and should not be considered restrictive of the scope of the invention, as described and claimed. Further, features or variations may be provided in addition to those set forth herein. For example, embodiments of the invention may be directed to various combinations and sub-combinations of the features described in the detailed description.

BRIEF DESCRIPTION OF THE SEVERAL VIEWS OF THE DRAWINGS

The present invention is described in the detailed description which follows in reference to the noted plurality of drawings by way of non-limiting examples of exemplary embodiments of the present invention.

FIG. 7 shows a graph of insertion loss versus frequency comparing different shapes of a vertical coaxial cable structure;

DETAILED DESCRIPTION

The present invention relates to the field of coaxial cables, and more particularly, to a high performance on-chip vertical coaxial cable, method of manufacturing the same and design structure thereof. More specifically, the present invention comprises an on-chip vertical coaxial cable structure having an inner conductor and an insulating material that coaxially surrounds the inner conductor. The structure further comprises an outer conductor which surrounds the insulating material. Both the inner and outer conductors are comprised of a plurality of metal layers formed on different wiring levels using back-end-of-line (BEOL) technology and interconnected between the different wiring levels by conductors. Advantageously, the high performance on-chip vertical coaxial cable can be built with desirable characteristic impedance, while having, in a preferred embodiment, increased Radio Frequency (RF) performance compared with prior art conventional on-chip horizontal coaxial cable.

Figure 9A:
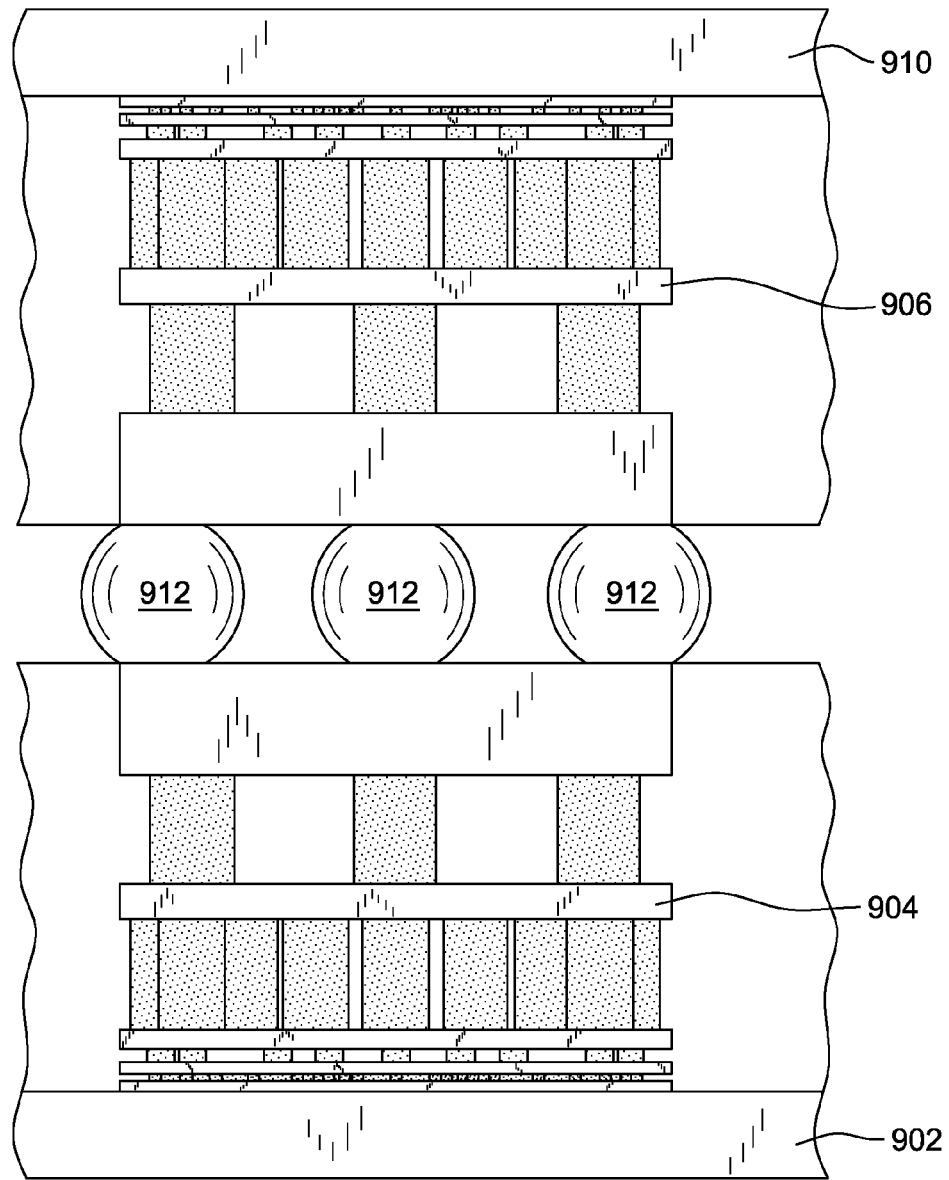
FIG. 9A illustrates a side view of one exemplary application of on-chip vertical coaxial cable structures according to an embodiment of the present invention.

In embodiments, the structure of the present invention includes multiple metal layers formed above the semiconductor portion of the substrate using BEOL technology. Within such structure, metal lines run parallel to the substrate and conductive vias run perpendicular to the substrate, the conductive vias interconnecting the different levels of metal wiring lines. The structure of the present invention is an improvement over prior art as it is oriented in substantially perpendicular alignment with the semiconductor portion of the substrate 902 (as shown in FIG. 9A). This advantageous alignment will provide enhanced design flexibility for high performance on-chip coaxial cable.

Figure 1:
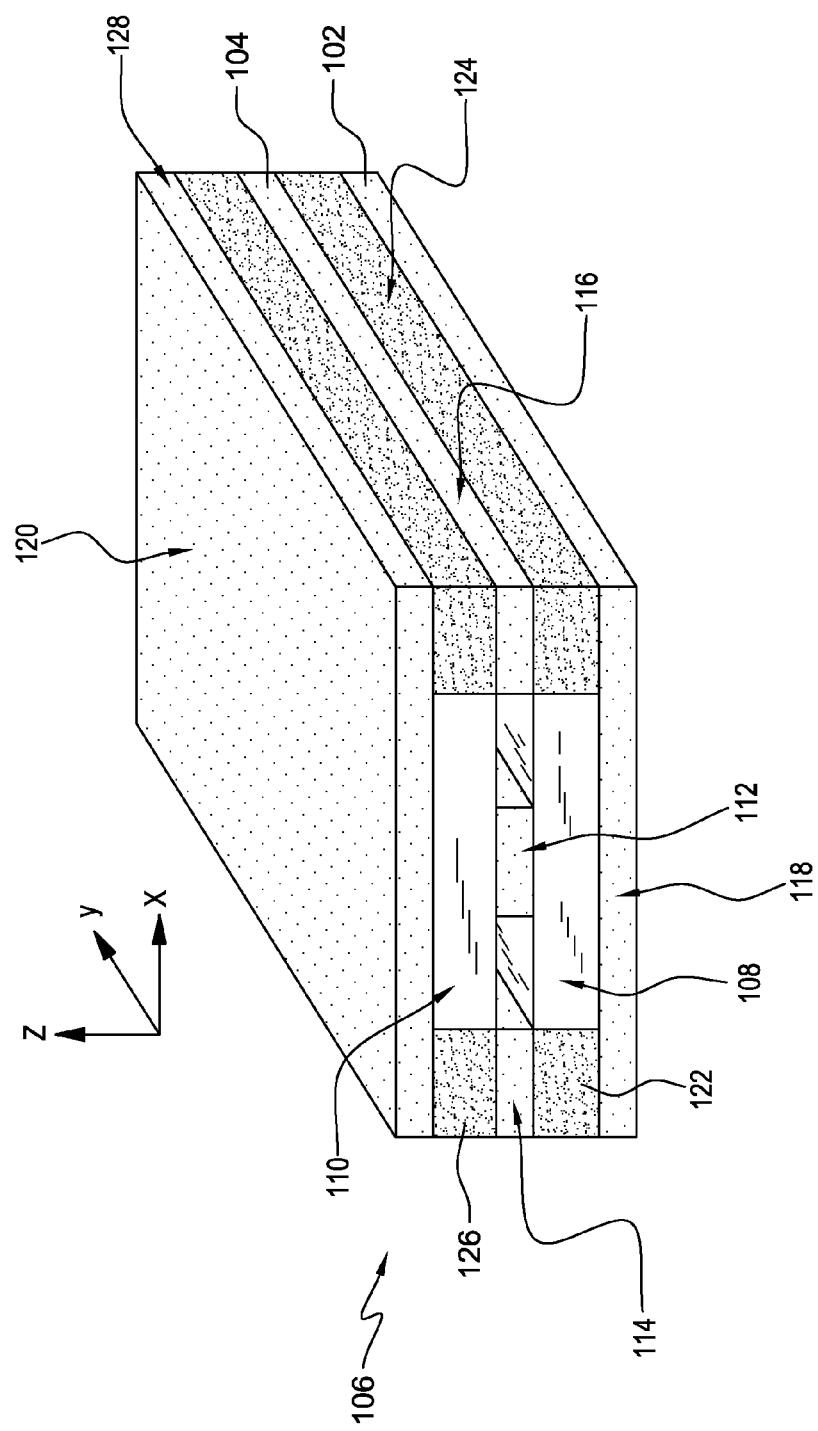
FIG. 1 illustrates a perspective view of a coaxial wire in a semiconductor chip according to the prior art.

FIG. 1 illustrates a perspective view of a horizontal coaxial wire in a semiconductor chip according to the prior art. Shown in FIG. 1 are metal layers 102, 104 and 106, dielectric layers 108 and 110, a signal wire 112, side shield wires 118 and 120, and vias 122, 124, 126 and 128. The vertical shield wires 118 and 120 are formed as wide traces according to well known techniques. The vertical shield wires 118 and 120 typically have same length as the signal wire 112. The side shield wires 114 and 116 are formed on opposite sides of the signal wire 112 according to well known techniques. The vertical shield wires 118 and 120 typically have a trace width that extends to the outside of the side shield wires 114 and 116.

Still referring to FIG. 1, the vias 122, 124, 126 and 128 are formed in the dielectric layers 108 and 110, in the same manner used for making vias in a typical semiconductor die. The length and width of the vias 122, 124, 126 and 128 are typically equal to the corresponding dimensions of the side shield wires 114 and 116. The vias 122, 124, 126 and 128 electrically connect the side shield wires 114 and 116 to the vertical shield wires 118 and 120 as shown in FIG. 1, so that the vias 122, 124, 126 and 128, the side shield wires 114 and 116, and the vertical shield wires 118 and 120 form a coaxial shield around the signal wire 112. It must be noted that the conventional design imposes, among other things, significant geometrical limitations. In particular, the distance between the vertical shield wires 118 and 120 and a signal wire 112 is limited by an available BEOL technology. Furthermore, the geometrical shape of the conventional horizontal coaxial wire is limited to a rectangular prism or cube. The present invention, however, contemplates that the shapes and dimensions of both the inner and outer conductors may vary to achieve the desired level of characteristic impedance and to improve the RF performance.

Figure 2:
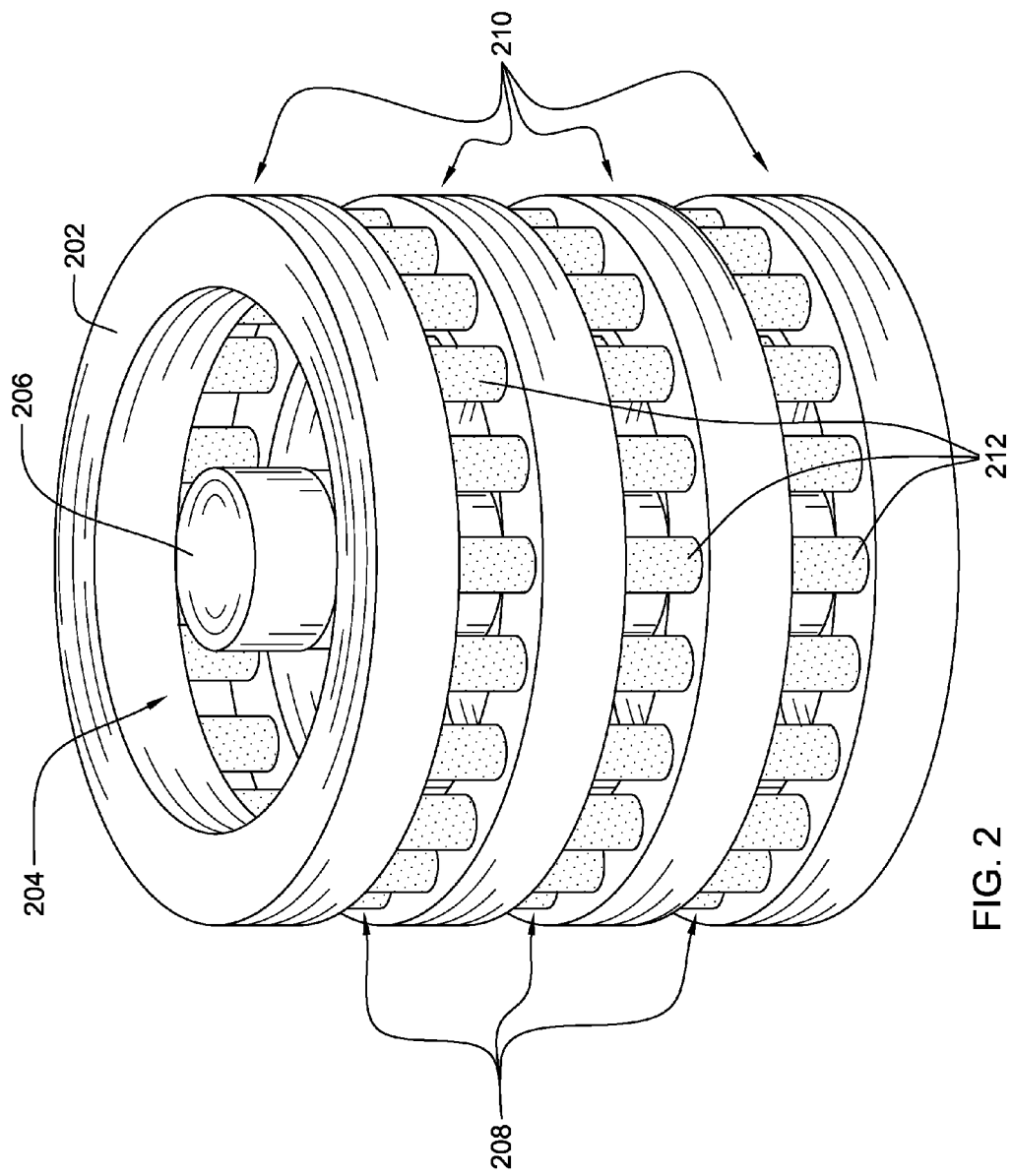
FIG. 2 illustrates a perspective view of a structure of cylindrically shaped vertical coaxial cable according to an embodiment of the present invention.

FIG. 2 illustrates a perspective view of a structure of cylindrically shaped vertical coaxial cable in accordance with aspects of the invention. The structure of the vertical coaxial cable includes an inner conductor 206 and an outer conductor 202. The inner conductor 206 comprises a signal line. In other words, the inner conductor 206 is utilized to transmit RF signals. The outer conductor 202 comprises a shielding layer or a ground line. Like in other types of coaxial cables, the electromagnetic field carrying the signal exists (ideally) only in the space between the inner conductor and outer conductor, so the coaxial cable cannot interfere with or suffer interference from external electromagnetic fields.

Figure 3:
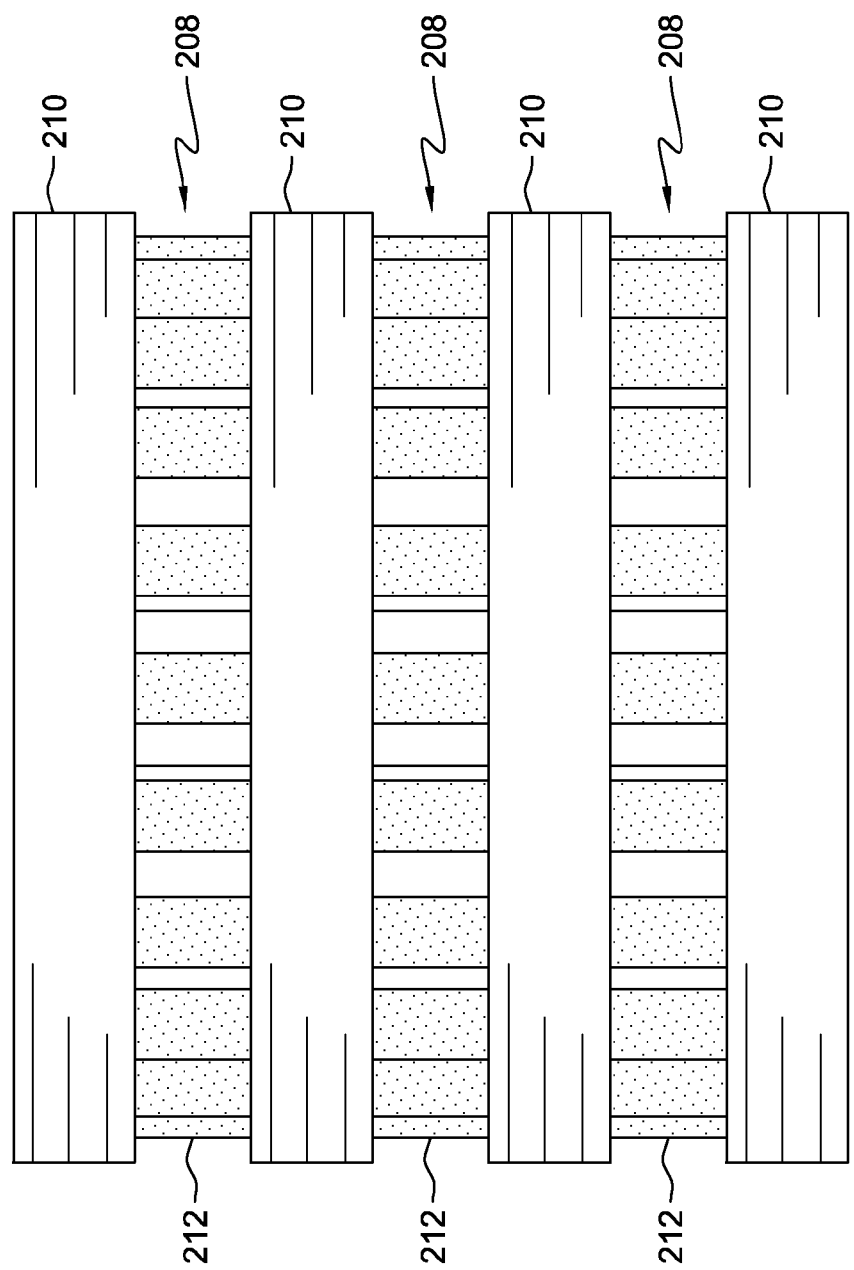
FIG. 3 illustrates a section view of the side of the cylindrically shaped vertical coaxial cable structure of FIG. 2.

As previously indicated, the structure of the outer conductor includes multiple metal layers formed above the semiconductor portion of the substrate using damascene processes conventionally associated with BEOL technology. Generally, the plurality of metal layers 210 are arranged in parallel above the semiconductor portion of the substrate. In a preferred embodiment, each metal layer 210 has circular shape. In FIGS. 2 and 3, the outer conductor structure 202 is shown with four metal layers 210; however, the number of metal layers can depend on type of the BEOL technology utilized and can be scaled for newer technologies. In embodiments of the invention, metal layers 210, 510, 610 can be made from any metal conductor. Advantageous metals for this purpose are aluminum (Al) or copper (Cu).

The structure of the outer conductor 202 also includes multiple dielectric layers 208 between each of the metal layers 210, as shown in FIGS. 2 and 3. Dielectric layers 208 may comprise any organic or inorganic material recognized by a person having ordinary skill in the art, which may be deposited by any number of well known conventional techniques such as sputtering, spin-on application, chemical vapor deposition (CVD) process or a plasma enhanced CVD (PECVD) process. Candidate inorganic dielectric materials for dielectric layers 208 may include, but are not limited to, silicon dioxide, fluorine-doped silicon glass (FSG), and combinations of these dielectric materials. Alternatively, the dielectric material constituting dielectric layers 208 may be characterized by a relative permittivity or dielectric constant smaller than the dielectric constant of silicon dioxide, which is about 3.9. Candidate low-k dielectric materials for dielectric layers 208 include, but are not limited to, porous and nonporous spin-on organic low-k dielectrics, such as spin-on aromatic thermoset polymer resins, porous and non-porous inorganic low-k dielectrics, such as organosilicate glasses, hydrogen-enriched silicon oxycarbide (SiCOH), and carbon-doped oxides, and combinations of organic and inorganic dielectrics. As illustrated in FIG. 2, in the preferred embodiment, dielectric layers 208 also have circular geometry.

Still referring to FIG. 2, metal layers 210 are interconnected by rows of spaced-apart vias 212 defined in dielectric layers 208. Vias are usually formed as holes in a dielectric layer that are filled with an electrically conductive metal, for example, the same material used in metal layers 210. The vias 212, which extend vertically in dielectric levels 208 of the BEOL structure, electrically connect adjacent metal layers 210.

According to an embodiment of the present invention, inner conductor 206 has a structure (not shown) substantially similar to the previously described structure of outer conductor 202. In a preferred embodiment, inner conductor 206 has the same shape as outer conductor 202 in order to keep the same level of characteristic impedance.

Figure 4:
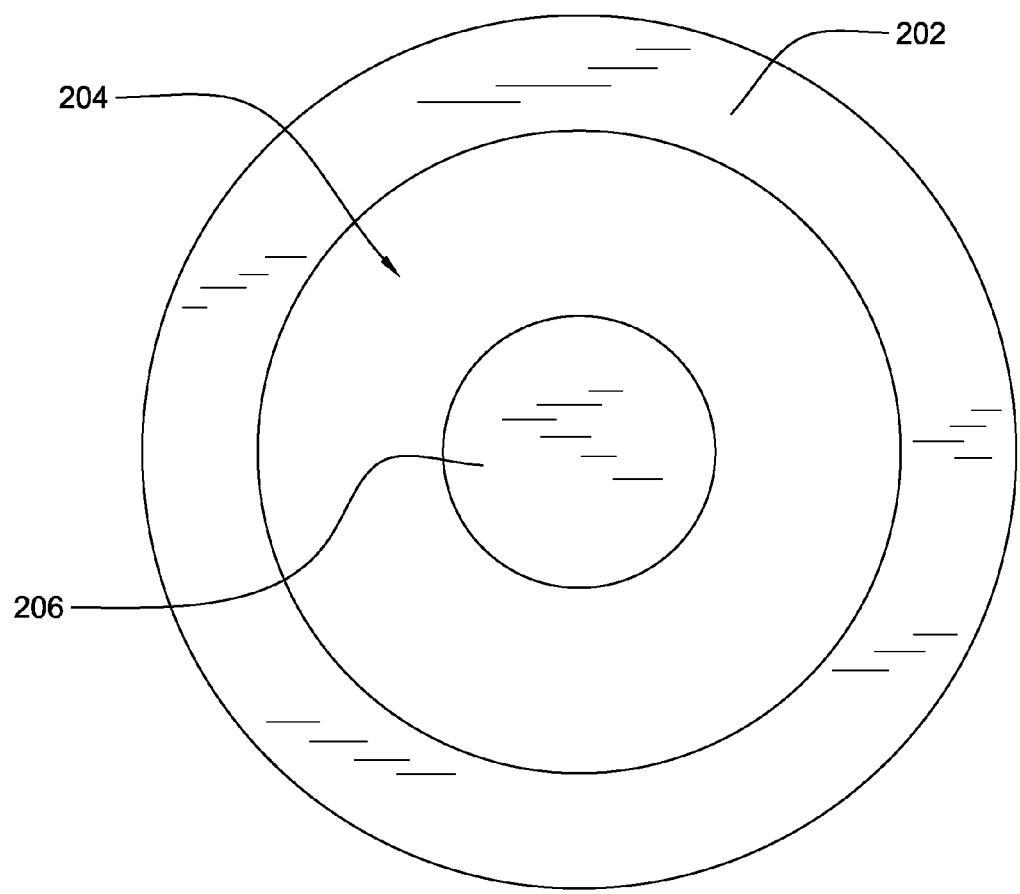
FIG. 4 illustrates a top view of the cylindrically shaped vertical coaxial cable structure of FIG. 2.

FIG. 4 illustrates a top view of the structure of cylindrically shaped vertical coaxial cable of FIG. 2. It must be noted that the structure of the vertical coaxial cable is oriented in substantially perpendicular alignment with the semiconductor portion of the substrate 902 (as shown in FIG. 9A). As shown in FIG. 4, the insulating material 204 coaxially surrounds inner conductor 206. Insulating material 204 is needed to maintain the spacing between inner conductor 206 and outer conductor 202. It must be noted that, outer conductor 202 coaxially surrounds insulating material 204. Insulating material 204 may comprise any organic or inorganic dielectric material recognized by a person having ordinary skill in the art. Fabrication of insulating material layer 204 in a BEOL structure may involve, for example, but not limited to, patterning of metal layers 212 using lithography and metal reactive ion etch (RIE) techniques. In an alternative embodiment, insulating material 204 may be air.

Figure 5A:
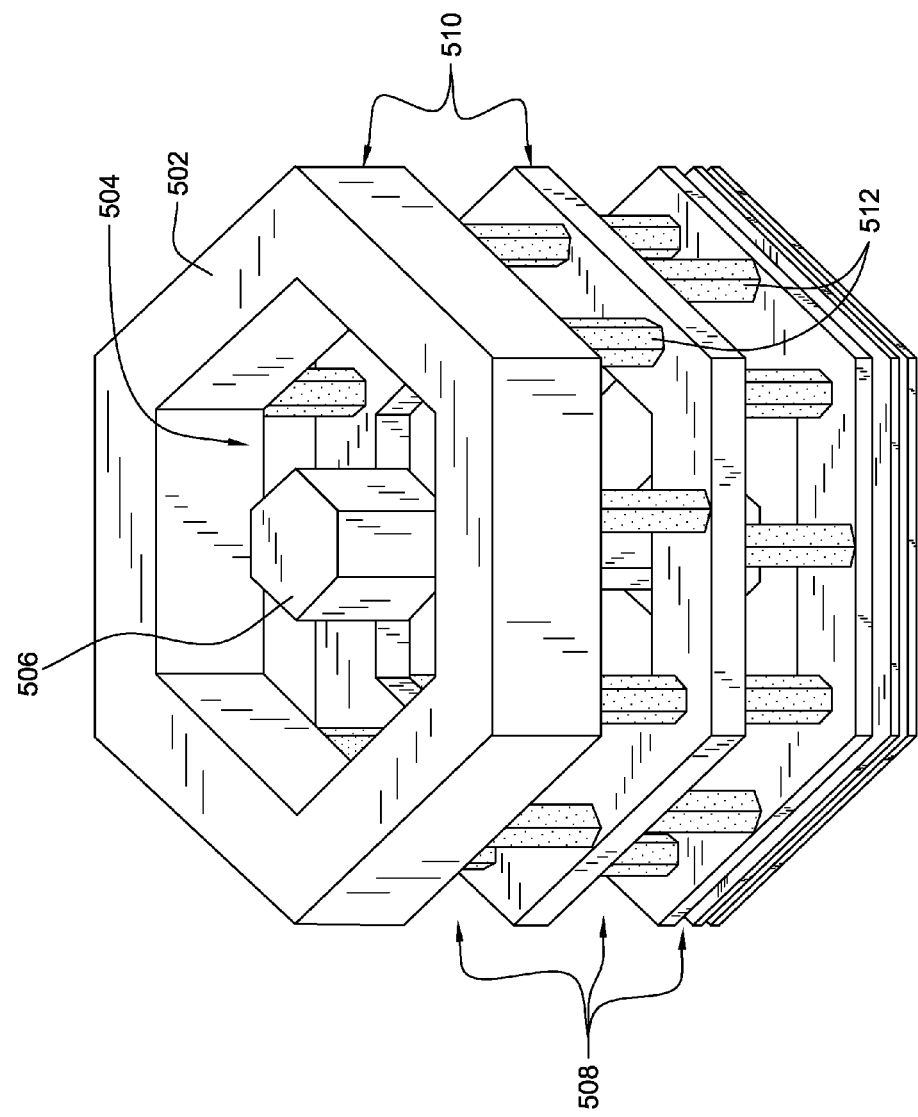
FIG. 5A illustrates a perspective view of a structure of a vertical coaxial cable shaped as a hexagonal prism according to an embodiment of the present invention.

FIG. 5A illustrates a perspective view of an alternative structure of vertical coaxial cable according to another embodiment of the present invention. In this embodiment vertical coaxial cable is shaped as a hexagonal prism. The structure of the vertical coaxial cable is substantially the same as that previously described in conjunction with FIGS. 2-4. Specifically, the structure of the vertical coaxial cable includes an inner conductor 506 and an outer conductor 502. In this embodiment, however, parallel metal layers 510 and parallel dielectric layers 508 are shaped as regular hexagons. It must be noted that the structure of the vertical coaxial cable is oriented in substantially perpendicular alignment with the semiconductor portion of the substrate 902 (as shown in FIG. 9A).

Figure 5B:
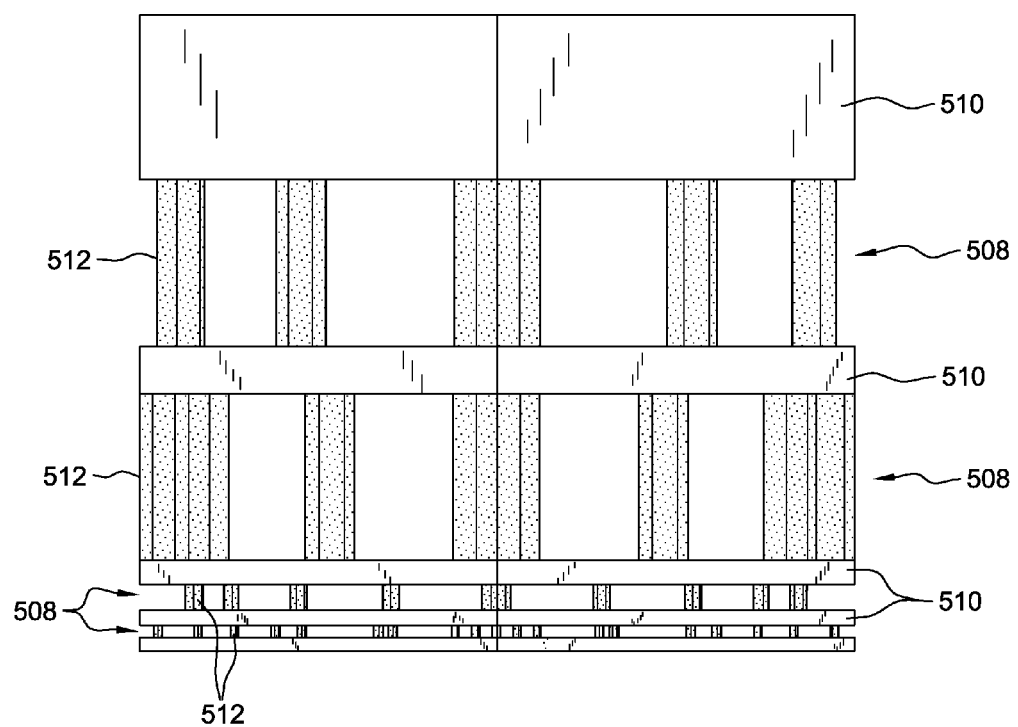
FIG. 5B illustrates a section view of the side of the vertical coaxial cable structure shaped as a hexagonal prism of FIG. 5A.
Figure 5C:
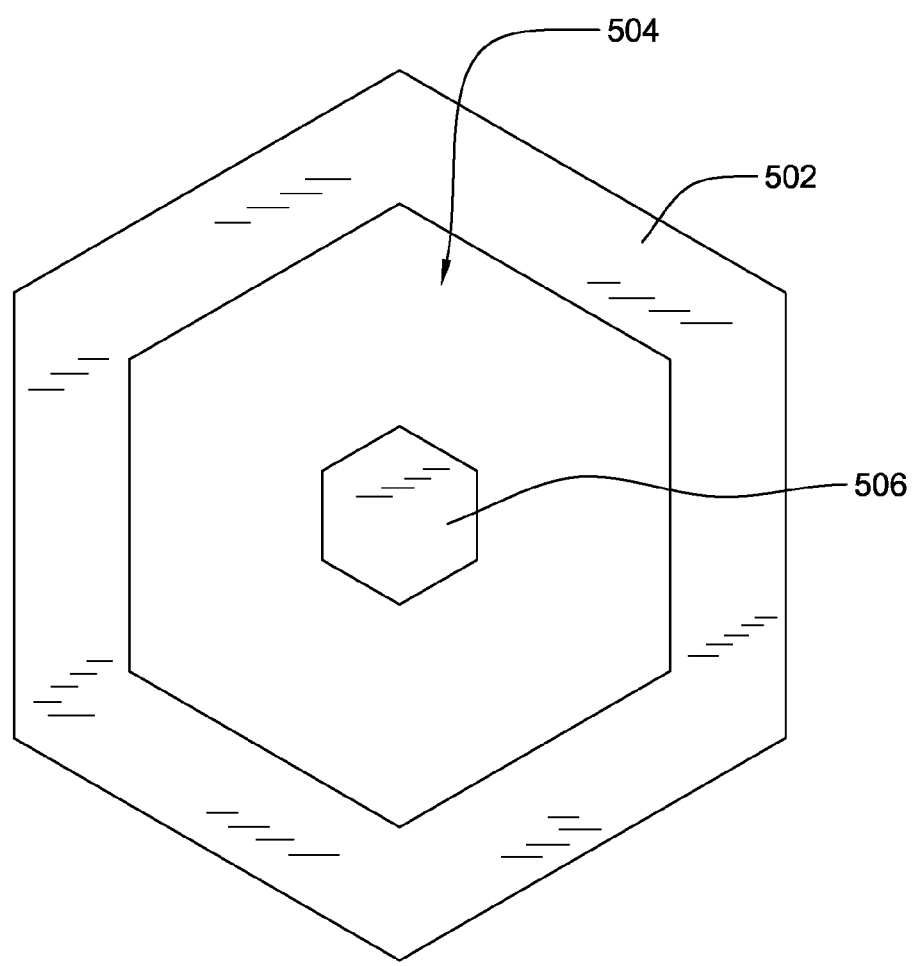
FIG. 5C illustrates a top view of the vertical coaxial cable structure shaped as a hexagonal prism of FIG. 5A.

FIGS. 5B and 5C illustrate a section view of the side and a top view of the vertical coaxial cable structure, respectively. As shown in FIG. 5B, metal layers 510 are interconnected by rows of spaced-apart vias 512 defined in dielectric layers 508. In this embodiment, vias 512 extend vertically along each side of hexagonally shaped metal layers 510. FIG. 5C shows that insulating material 504 coaxially surrounds inner conductor 506 and is similarly shaped as a hexagon.

Figure 6A:
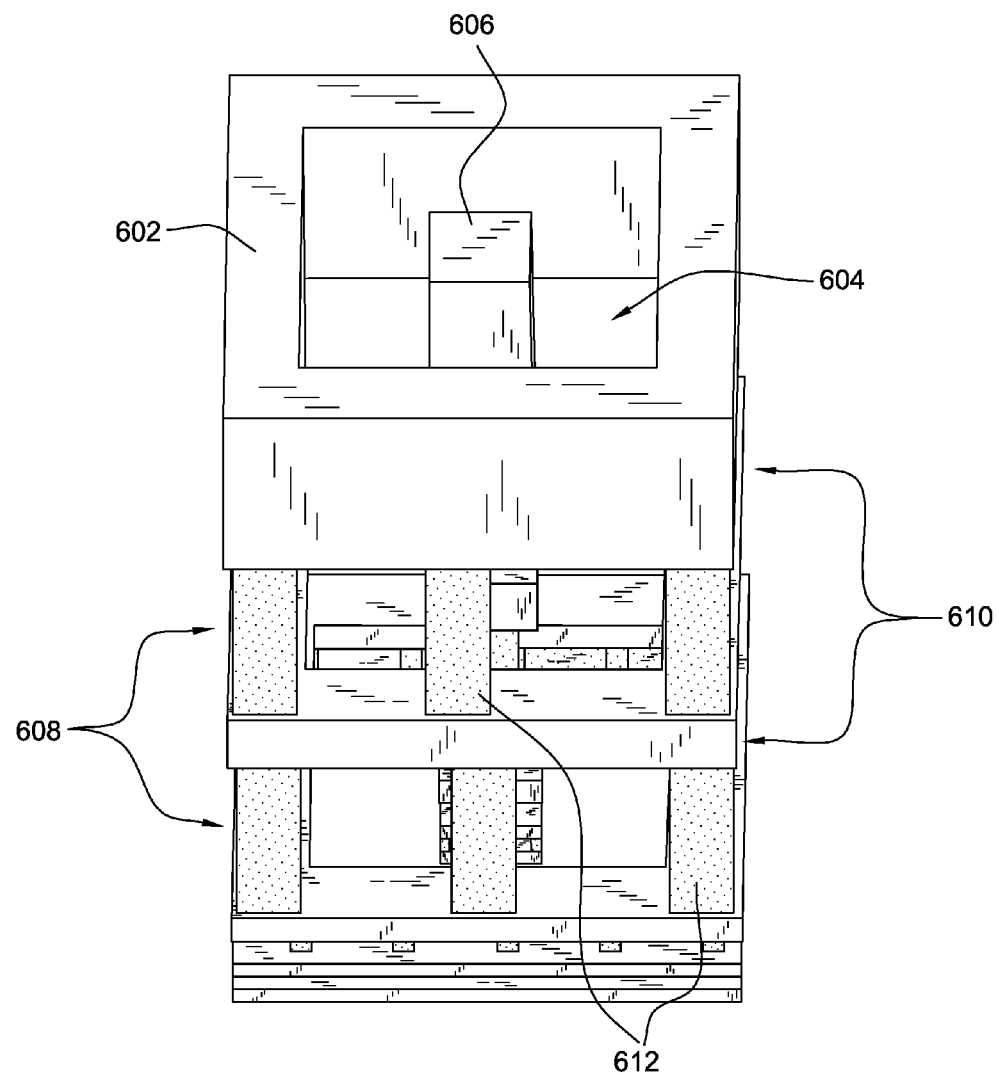
FIG. 6A illustrates a perspective view of a structure of a vertical coaxial cable shaped as a uniform prism according to an embodiment of the present invention.

FIG. 6A illustrates a perspective view of a structure of vertical coaxial cable according to yet another embodiment of the present invention. In this embodiment vertical coaxial cable is shaped as a substantially uniform prism. The structure of the vertical coaxial cable is substantially the same as that previously described in conjunction with FIGS. 2-4. Specifically, the structure of the vertical coaxial cable includes an inner conductor 606 and an outer conductor 602. In this embodiment, parallel metal layers 610 and parallel dielectric layers 608 are shaped as squares. It must be noted that the structure of the vertical coaxial cable is oriented in substantially perpendicular alignment with the semiconductor portion of the substrate 902 (as shown in FIG. 9A).

Figure 6B:
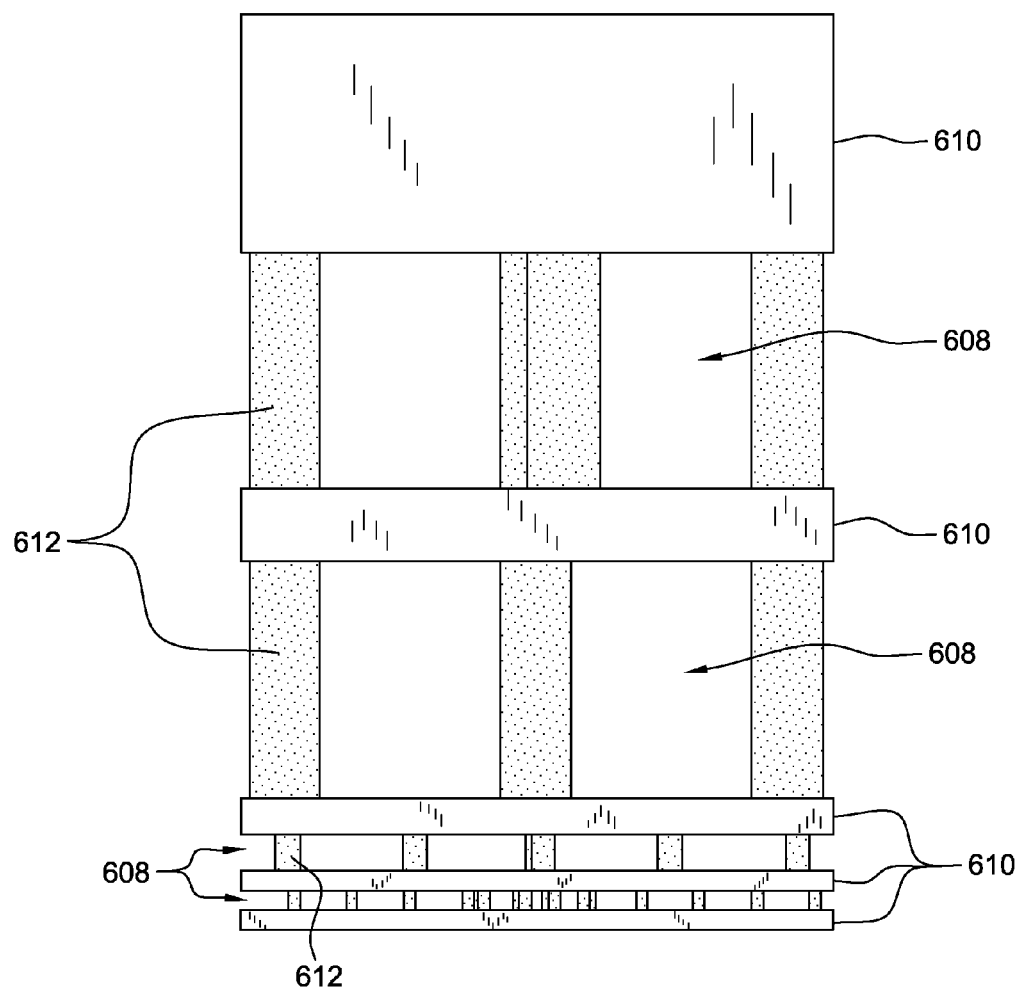
FIG. 6B illustrates a section view of the side of the vertical coaxial cable structure shaped as a uniform prism of FIG. 6A.
Figure 6C:
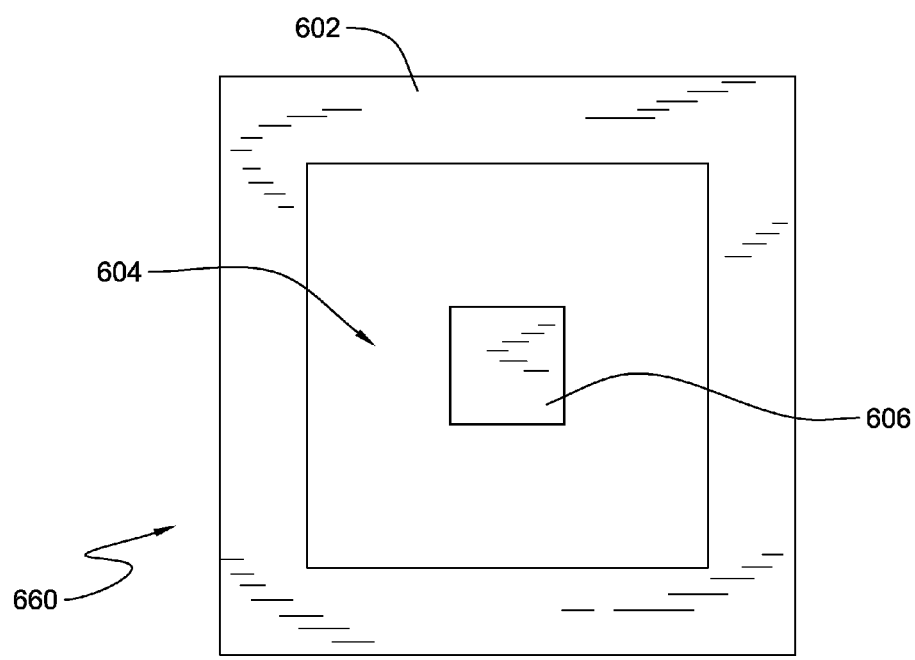
FIG. 6C illustrates a top view of the vertical coaxial cable structure shaped as a uniform prism of FIG. 6A.

FIGS. 6B and 6C illustrate a section view of the side and a top view of the vertical coaxial cable structure, respectively. As shown in FIG. 6B, metal layers 610 are interconnected by rows of spaced-apart vias 612 defined in dielectric layers 608. In this embodiment, vias 612 extend vertically along each side of metal layers 610 shaped as squares. FIG. 6C shows that insulating material 604 coaxially surrounds inner conductor 606 and is similarly shaped as a square.

FIG. 7 shows a graph of insertion loss versus frequency comparing different shapes of the vertical coaxial cable structure in accordance with aspects of the invention. The essential function of coaxial cables is to transmit high frequency energy and signals with low loss. Insertion loss is a common measurement that is used to determine the loss of signal power resulting from the interference from external electromagnetic fields. As shown in FIG. 7, the cylindrically shaped vertical coaxial cable shows 702 a factor of at least two (2) decrease in insertion loss at frequency over 60 GHz, compared to other geometric shapes of the coaxial wire, such as hexagonal prism 704 and substantially uniform prism 706. This graph demonstrates that changing a shape of the coaxial cable according to aspects of the present invention will result in improved RF performance relative to the prior art.

Figure 8:
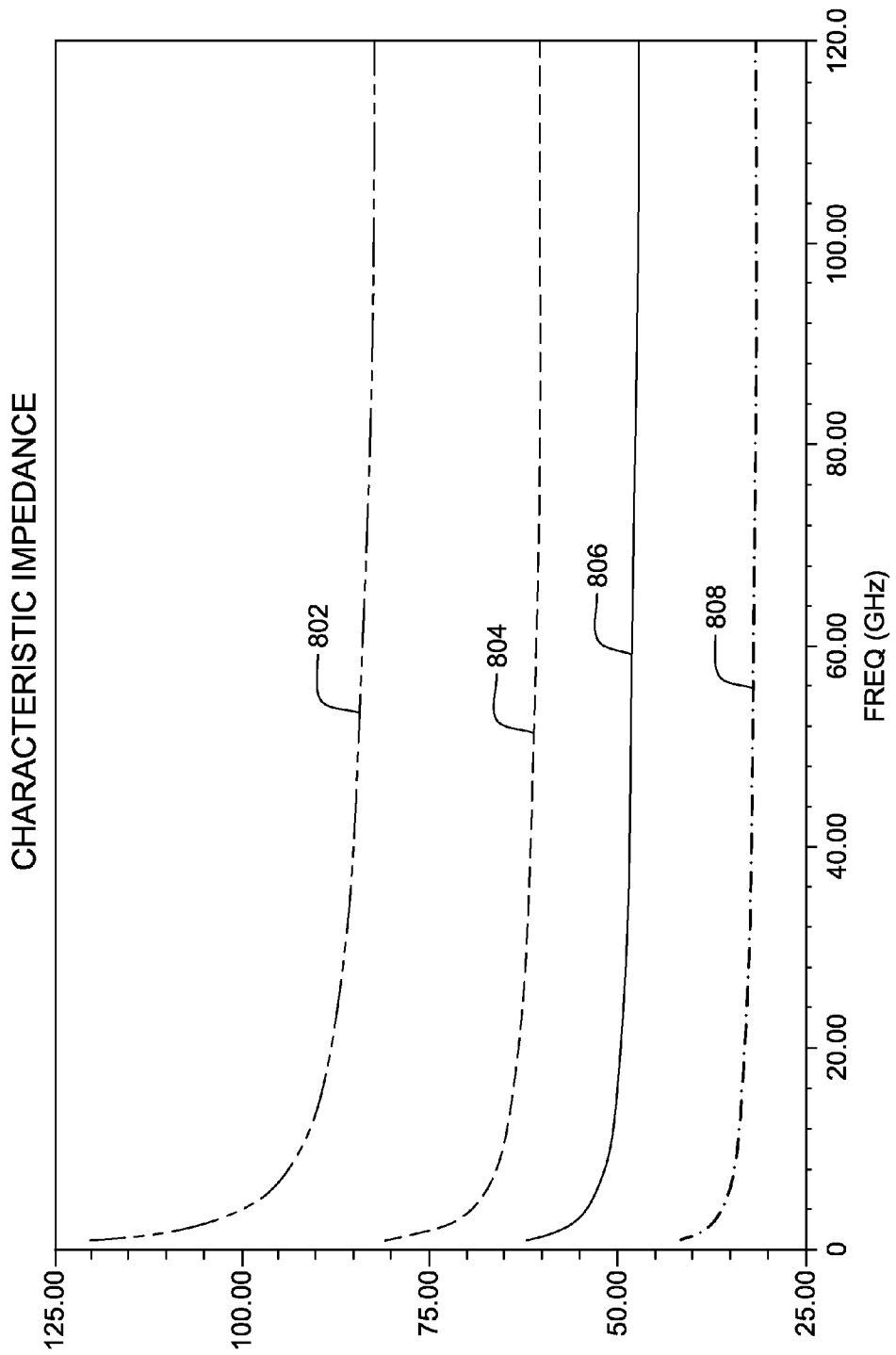
FIG. 8 is a graph that shows relationships between the dimensions of the inner and outer conductors and the characteristic impedance.

FIG. 8 is a graph that shows relationships between the dimensions of the inner and outer conductors and the characteristic impedance. The characteristic impedance ($Z_0$) of a coaxial cable is independent of its length but depends on the intrinsic impedance ($\acute{\eta}=\sqrt{\mu/\epsilon}$, where $\mu$ and $\epsilon$ are, respectively, the permittivity and permeability of the insulating material 204) of the insulating material 204 filling the space between the conductors 202 and 206, the diameter (D) of the outer conductor 202 and the diameter (d) of the inner conductor 206, and can be approximated by the following equation:

$$Z_0=(\acute{\eta}/2\pi)ln(D/d).$$

FIG. 8 demonstrates that changing a radius of inner conductor 206 of cylindrically shaped vertical coaxial cable structure shown, for example, in FIG. 2, while keeping a radius of outer conductor 202 constant has substantial effect on the characteristic impedance of coaxial cable. For example, as shown in FIG. 8, changing a radius of inner conductor 206 from 3 micron 806 to 1 micron 802 shows a factor of approximately 1.8 improvement of characteristic impedance. Similarly, changing a radius of inner conductor 206 from 5 micron 808 to 2 micron 804 shows a factor of approximately 1.85 improvement of characteristic impedance. In this exemplary embodiment, the radius of outer conductor 202 remains constant (7 microns). It must be noted that comparable results can be achieved with other exemplary embodiments of the present invention. For example, if the vertical coaxial cable is shaped as a substantially uniform prism shown, for example, in FIG. 6A, the characteristic impedance can be controlled by varying the length of each side of inner conductor 606. Furthermore, while illustrative embodiments of the present invention are described with respect to changing dimensions of inner conductor 206, 506, 606, the present invention is not so limited. More particularly, the characteristic impedance may be controlled by changing dimensions of outer conductor 202, 502, 602 instead.

Figure 9B:
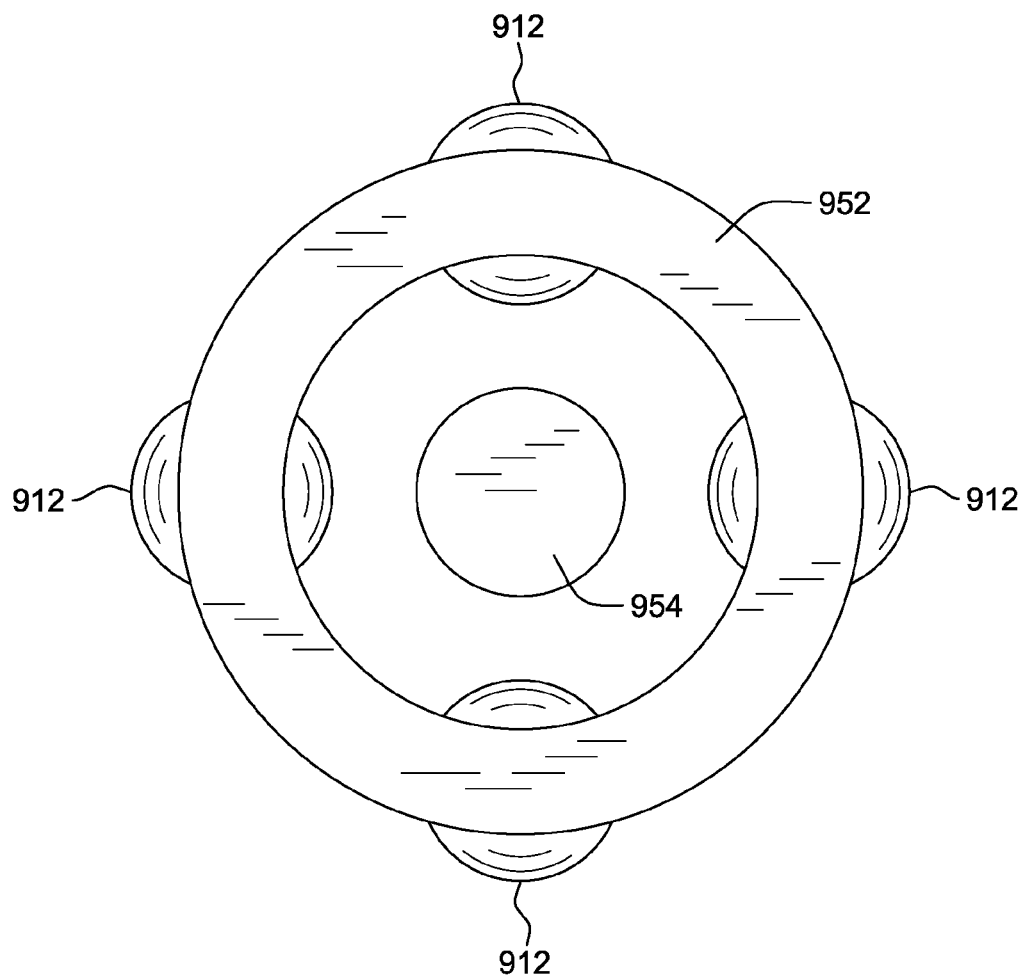
FIG. 9B illustrates a top view of one exemplary application of on-chip vertical coaxial cable structures of FIG. 9A.

FIG. 9A illustrates one exemplary application of high-performance on-chip vertical coaxial cable in accordance with embodiments of the present invention. As shown in FIG. 9A, vertical coaxial cables can be used as an inter-substrate connection. In this view it is seen that first vertical coaxial cable structure 904 (previously described in conjunction with FIGS. 2-6C) is connected to a chip (not shown) and positioned perpendicular to the top surface of lower semiconductor substrate 902. Second vertical coaxial cable structure 906 is positioned in a minor image orientation relative to first vertical coaxial cable structure 904. Second vertical coaxial cable 906 is positioned perpendicular to the lower surface of upper semiconductor substrate 910. Outer conductor 952 of first vertical coaxial cable 904 is joined with outer conductor (not shown) of second vertical coaxial cable 906 by solder balls 912, and inner conductor 954 of first vertical coaxial cable 904 is joined with inner conductor (not shown) of second vertical coaxial cable 906 by solder balls 912, as seen in FIG. 9B. The exemplary interconnection structure illustrated in FIG. 9A allows high frequency inter-substrate signal transmission via respective inner conductors 954. Embodiments of the present invention contemplate that on-chip vertical coaxial cable structure described herein can be used for, for example, but not limited to, connections with through silicon vias (TSVs) and various vertical components of integrated circuits.

Thus, as described above, the present invention comprises an on-chip vertical coaxial cable structure having an inner conductor and an outer conductor that coaxially surrounds the inner conductor. Those conductors, comprising a plurality of metal layers and interconnected by a plurality of vias, are formed using back-end-of-the-line (BEOL) technology. The structures of the present invention could have any desirable shape. Advantageously, the high performance on-chip vertical coaxial cable can be built with a desired characteristic impedance, while having better RF performance compared with prior art conventional on-chip horizontal coaxial cable.

Design Structure

Figure 10:
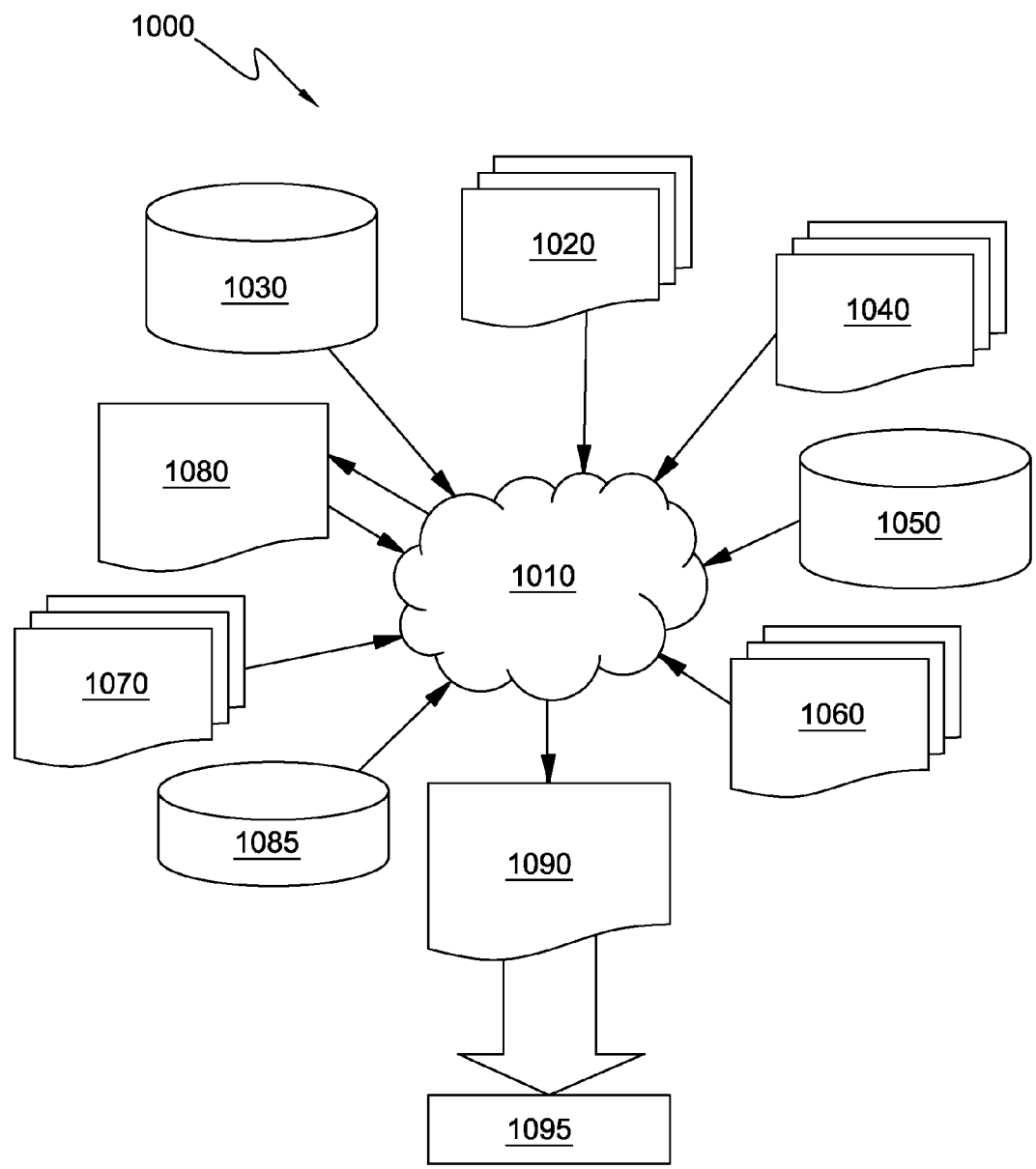
FIG. 10 is a flow diagram of a design process used in semiconductor design, manufacture, and/or test.

FIG. 10 shows a block diagram of an exemplary design flow 1000 used for example, in semiconductor IC logic design, simulation, test, layout, and manufacture. Design flow 1000 includes processes, machines and/or mechanisms for processing design structures or devices to generate logically or otherwise functionally equivalent representations of the design structures and/or devices described above and shown in FIGS. 2-6C. The design structures processed and/or generated by design flow 1000 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1000 may vary depending on the type of representation being designed. For example, a design flow 1000 for building an application specific IC (ASIC) may differ from a design flow 1000 for designing a standard component or from a design flow 1000 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 1020 that is preferably processed by a design process 1010. Design structure 1020 may be a logical simulation design structure generated and processed by design process 1010 to produce a logically equivalent functional representation of a hardware device. Design structure 1020 may also or alternatively comprise data and/or program instructions that when processed by design process 1010, generate a functional representation of the physical structure of a hardware device. Whether representing functional and/or structural design features, design structure 1020 may be generated using electronic computer-aided design (ECAD) such as implemented by a core developer/designer. When encoded on a machine-readable data transmission, gate array, or storage medium, design structure 1020 may be accessed and processed by one or more hardware and/or software modules within design process 1010 to simulate or otherwise functionally represent an electronic component, circuit, electronic or logic module, apparatus, device, or system such as those shown in FIGS. 2-6C. As such, design structure 1020 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1010 preferably employs and incorporates hardware and/or software modules for synthesizing, translating, or otherwise processing a design/simulation functional equivalent of the components, circuits, devices, or logic structures shown in FIGS. 2-6C to generate a netlist 1080 which may contain design structures such as design structure 1020. Netlist 1080 may comprise, for example, compiled or otherwise processed data structures representing a list of wires, discrete components, logic gates, control circuits, I/O devices, models, etc. that describes the connections to other elements and circuits in an integrated circuit design. Netlist 1080 may be synthesized using an iterative process in which netlist 1080 is resynthesized one or more times depending on design specifications and parameters for the device. As with other design structure types described herein, netlist 1080 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1010 may include hardware and software modules for processing a variety of input data structure types including netlist 1080. Such data structure types may reside, for example, within library elements 1030 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1040, characterization data 1050, verification data 1060, design rules 1070, and test data files 1085 which may include input test patterns, output test results, and other testing information. Design process 1010 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1010 without deviating from the scope and spirit of the invention. Design process 1010 may also include modules for performing standard circuit design processes such as timing analysis, verification, design rule checking, place and route operations, etc.

Design process 1010 employs and incorporates logic and physical design tools such as HDL compilers and simulation model build tools to process design structure 1020 together with some or all of the depicted supporting data structures along with any additional mechanical design or data (if applicable), to generate a second design structure 1090. Design structure 1090 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 1020, design structure 1090 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2-6C. In one embodiment, design structure 1090 may comprise a compiled, executable HDL simulation model that functionally simulates the devices shown in FIGS. 2-6C.

Design structure 1090 may also employ a data format used for the exchange of layout data of integrated circuits and/or symbolic data format (e.g. information stored in a GDSII (GDS2), GL1, OASIS, map files, or any other suitable format for storing such design data structures). Design structure 1090 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2-6C. Design structure 1090 may then proceed to a stage 1095 where, for example, design structure 1090 proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method of forming a coaxial cable structure, comprising:

forming a first shape of an inner conductor in a plurality of metal layers formed on different wiring levels and interconnected between the different wiring levels by a first conductor;

forming a second shape of an outer conductor in the plurality of metal layers formed on different wiring levels and interconnected between the different wiring levels by a second conductor;

wherein the coaxial cable structure is formed upon a surface of a semiconductor substrate and is oriented in substantially perpendicular alignment with the surface.

2. The method of claim 1, wherein forming the first shape further comprises forming a first plurality of vias providing electrical contact between adjacent metal layers of the plurality of inner conductor layers and forming the second shape further comprises forming a second plurality of vias providing electrical contact between adjacent metal layers of the plurality of outer conductor layers.

3. The method of claim 1, wherein the first shape is a cylinder and the second shape is a cylinder.

4. The method of claim 3, wherein a characteristic impedance of the coaxial cable is controlled by selectively changing a radius of the inner conductor or a radius of the outer conductor.

5. The method of claim 1, wherein the first shape is a substantially uniform prism and the second shape is a substantially uniform prism.

6. The method of claim 5, wherein a characteristic impedance of the coaxial cable is controlled by selectively changing the length of each side of the inner conductor or the length of each side of the outer conductor.

7. The method of claim 1, wherein the first shape is a hexagonal prism and the second shape is a hexagonal prism.

8. The method of claim 7, wherein a characteristic impedance of the coaxial cable is controlled by selectively changing the length of each side of the inner conductor or the length of each side of the outer conductor.

9. The method of claim 1, wherein the inner conductor comprises a signal line and the outer conductor comprises a ground line.

10. A design structure tangibly embodied in a machine readable medium for designing, manufacturing, or testing an integrated circuit, the design structure comprising:

an inner conductor comprising a plurality of metal layers formed on different wiring levels and interconnected between the different wiring levels by a first conductor;

an insulating material coaxially surrounding the inner conductor; and an outer conductor coaxially surrounding the insulating material comprising a plurality of metal layers formed on the different wiring levels and interconnected between the different wiring levels by a second conductor;

wherein the coaxial cable structure is formed upon a surface of a semiconductor substrate and is oriented in substantially perpendicular alignment with the surface.

11. The design structure of claim 10, wherein the design structure comprises a netlist.

12. The design structure of claim 10, wherein the design structure resides on storage medium as a data format used for the exchange of layout data of integrated circuits.

13. The design structure of claim 10, wherein the design structure resides in a programmable gate array.

* * * * *